US012278187B1

(12) United States Patent
Park et al.

(10) Patent No.: US 12,278,187 B1
(45) Date of Patent: Apr. 15, 2025

(54) INTEGRATED STRUCTURE HAVING A P-TYPE SEMICONDUCTOR DIFFUSION BARRIER LAYER FORMING A VAN DER WAALS JUNCTION WITH A P-TYPE SUBSTRATE AND ELECTRONIC DEVICE INCLUDING THE SAME

(71) Applicant: INDUSTRY-ACADEMIC COOPERATION FOUNDATION GYEONGSANG NATIONAL UNIVERSITY, Jinju-si (KR)

(72) Inventors: Jun Hong Park, Jinju-si (KR); Do Hyeon Lee, Jinju-si (KR); Su Yeon Cho, Ulsan (KR)

(73) Assignee: INDUSTRY-ACADEMIC COOPERATION FOUNDATION GYEONGSANG NATIONAL UNIVERSITY, Jinju-si (KR)

( * ) Notice: Subject to any disclaimer, the term of this patent is extended or adjusted under 35 U.S.C. 154(b) by 0 days.

(21) Appl. No.: 18/934,307

(22) Filed: Nov. 1, 2024

(30) Foreign Application Priority Data

Nov. 6, 2023 (KR) ........................ 10-2023-0151913

(51) Int. Cl.
*H10D 64/64* (2025.01)
*H01L 21/02* (2006.01)
(Continued)

(52) U.S. Cl.
CPC .. *H01L 23/53266* (2013.01); *H01L 21/02568* (2013.01); *H01L 21/28537* (2013.01);
(Continued)

(58) Field of Classification Search
CPC ......... H01L 21/28537; H01L 21/28568; H01L 21/02568; H01L 21/02417; H10D 8/60; H10D 8/051; H10D 64/64; H10D 64/647
See application file for complete search history.

(56) References Cited

U.S. PATENT DOCUMENTS 10,134,628 B2    11/2018  Song et al.
10,217,819 B2 *   2/2019  Lee ........................ H10D 64/62
(Continued)

FOREIGN PATENT DOCUMENTS

KR    1020170014870 A    2/2017
KR     101732943 B1      5/2017
(Continued)

*Primary Examiner* — Younes Boulghassoul
(74) *Attorney, Agent, or Firm* — Bridgeway IP Law Group, PLLC; Jihun Kim (57) ABSTRACT

An integrated structure according to a preferred embodiment may include a silicon or silicon-on-insulator (SOI) substrate, a conductive layer spaced apart from the substrate and including a metal or a metal compound, and a diffusion barrier layer provided therebetween. The substrate and the diffusion barrier layer may directly contact and form a van der Waals junction. Since the diffusion barrier layer may block diffusion of metal atoms into the substrate lattice by blocking movement of materials (atoms) between the substrate and the conductive layer and may also control injection of holes from the conductive layer toward the substrate, defects at the metal-semiconductor interface may be controlled to overcome the limitations of ultra-fine and highly integrated semiconductors.

9 Claims, 5 Drawing Sheets

(51) Int. Cl.
  *H01L 21/285* (2006.01)
  *H01L 23/528* (2006.01)
  *H01L 23/532* (2006.01)
(52) U.S. Cl.
  CPC ......... *H01L 23/5283* (2013.01); *H10D 64/64* (2025.01); *H10D 64/647* (2025.01)

(56) References Cited

U.S. PATENT DOCUMENTS

| | | |
|---|---|---|
| 11,043,454 B2 | 6/2021 | Hegde et al. |
| 11,276,644 B2 | 3/2022 | Naylor et al. |
| 11,430,666 B2 | 8/2022 | Chuu et al. |
| 11,652,147 B1 * | 5/2023 | Zhang .................... H10D 64/62 257/29 |
| 2017/0033003 A1 * | 2/2017 | Song ................ H01L 23/53238 |
| 2018/0226248 A1 * | 8/2018 | Jahangir ........... H01L 21/02488 |
| 2022/0140100 A1 * | 5/2022 | Cho ....................... H10D 64/64 257/288 |
| 2022/0293735 A1 | 9/2022 | Wang et al. |
| 2024/0313080 A1 * | 9/2024 | Chiu ..................... H10D 64/64 |

FOREIGN PATENT DOCUMENTS

| | | |
|---|---|---|
| KR | 1020200090088 A | 7/2020 |
| KR | 102311451 B1 | 10/2021 |
| KR | 1020220031600 A | 3/2022 |

\* cited by examiner

INTEGRATED STRUCTURE HAVING A P-TYPE SEMICONDUCTOR DIFFUSION BARRIER LAYER FORMING A VAN DER WAALS JUNCTION WITH A P-TYPE SUBSTRATE AND ELECTRONIC DEVICE INCLUDING THE SAME

CROSS-REFERENCE TO RELATED APPLICATIONS

This application claims the priority of Korean Patent Application No. 10-2023-0151913 filed on Nov. 6, 2023, in the Korean Intellectual Property Office, the disclosure of which is incorporated herein by reference.

BACKGROUND OF THE INVENTION

Field of the Invention

The present invention relates to an integrated structure including a diffusion barrier layer, and more particularly, to an integrated structure including a diffusion barrier layer for reducing interface defects at a semiconductor-metal interface.

Background of the Related Art

In order to implement a technique of fusing artificial intelligence and Internet of Things (IoT), development of intelligent semiconductor synapse elements that may operate at a low power is actively conducted worldwide. In particular, for the sake of advancement in realistic non-contact industry and national safety networks in the post COVID-19 era, autonomous control devices for autonomously collecting, learning, determining, and processing information are required. In addition, the need for Neural Processing Unit (NPU) as an artificial intelligence semiconductor optimized for deep learning algorithm operations is emerging in the artificial intelligence techniques widely used in the 4th industry including big data analysis, autonomously driving vehicles, and the like, and since most of existing computing semiconductors centered on the Central Processing Unit (CPU) are expected to be replaced with NPUs, which are artificial intelligence semiconductors, importance of developing advanced semiconductors having driving performance capable of processing a large amount of information at a high speed and a low power is further emphasized.

A metal-semiconductor interface is one of factors that may directly affect injection of electrons and output of current and determine performance of a semiconductor device, and a technique of reducing defects at the interface between a metal material used as an electrode or the like and a semiconductor channel, particularly, the metal-semiconductor interface formed by diffusion and intermixing of materials (atoms), is essential. Furthermore, unlike in the past, as the current semiconductor process technique is approaching the sub-nano (sub-1 nm) level, the design of quasi-ideal interfaces at the ultra-fine scale is very important to overcome the limitations of ultra-fine and highly integrated semiconductors in the future.

SUMMARY OF THE INVENTION

Therefore, the present invention has been made in view of the above problems, and it is an object of the present invention to provide an integrated structure that can control metal-semiconductor interface defects to overcome the limitations of ultra-fine and highly integrated semiconductors, and an electronic device including the same.

To accomplish the above object, according to one aspect of the present invention, there is provided an integrated structure comprising: a silicon or silicon-on-insulator (SOI) substrate; a conductive layer spaced apart from the substrate and including a metal or a metal compound; and a diffusion barrier layer provided between the substrate and the conductive layer.

The substrate and the diffusion barrier layer may directly contact and form a van der Waals junction.

The diffusion barrier layer may include a p-type semiconductor material.

The diffusion barrier layer may be a monolayer.

The thickness of the diffusion barrier layer is 0.1 to 10 Å.

The diffusion barrier layer may include a transition metal dichalcogenide material.

The transition metal dichalcogenide material may be expressed as chemical formula $MX_2$, wherein M may be a transition metal element including Mo, W, Nb, V, Ta, Ti, Zr, Hf, Tc, Re, Ru, Co, Pd, Pt, Cu, Ga, In, Sn, Ge, Pb, or a combination of two or more selected from these, and X may be a chalcogen element including S, Se, Te, or a combination of two or more selected from these.

The transition metal dichalcogenide material may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PdTe_2$, or a combination of two or more selected from these.

The crystal structure of the transition metal dichalcogenide material may be a hexagonal structure in a plane direction.

The metal may include Ti, Ni, Cr/Au, Ag, or a combination of two or more selected from these.

Movement of materials (atoms) between the conductive layer and the substrate may be blocked.

Injection of electrons from the substrate to the conductive layer may be blocked.

Injection of holes from the conductive layer to the substrate may be performed.

An electronic device may include an integrated structure including any one selected from those described above.

DETAILED DESCRIPTION OF THE PREFERRED EMBODIMENT

Hereinafter, preferred embodiments of the present invention will be described in detail with reference to the accompanying drawings. The advantages and features of the present invention and the method for achieving them will become clear by referring to the embodiments described below in detail together with the accompanying drawings. However, the present invention is not limited to the embodiments disclosed below and will be implemented in various different forms. These embodiments are provided only to make the disclosure of the present invention complete and to fully inform those skilled in the art of the scope of the present invention, and the present invention is only defined by the scope of the claims. Like reference numerals refer to like elements throughout the specification.

Unless defined otherwise, all the terms (including technical and scientific terms) used in this specification may be used as meanings that can be commonly understood by those skilled in the art. In addition, terms defined in commonly used dictionaries are not interpreted ideally or excessively unless clearly and specifically defined. The terms used in this specification are to describe the embodiments and are not to limit the present invention. In this specification, singular forms also include plural forms unless specifically stated otherwise in the phrases.

The terms "comprises, includes" and/or "comprising, including" used in this specification means that the mentioned components, steps, operations, and/or elements do not exclude the presence or addition of one or more other components, steps, operations and/or elements.

Integrated Structure Including a Diffusion Barrier Layer

Figure 1:
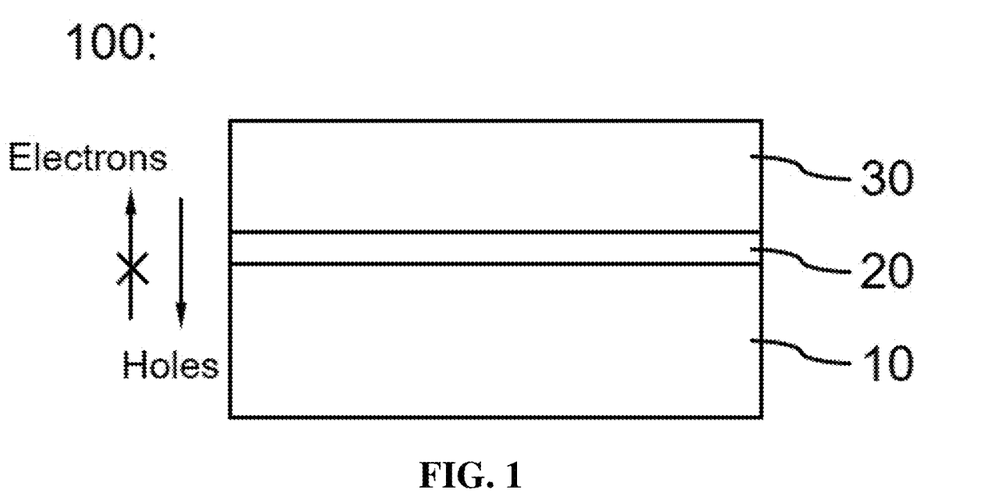
FIG. 1 is a mimetic view showing the operation of a diffusion barrier layer in the cross-section of an integrated structure according to an embodiment of the present invention.

FIG. 1 is a mimetic view showing the cross-section of an integrated structure 100 having a diffusion barrier layer 20 according to an embodiment of the present invention.

Referring to FIG. 1, the integrated structure 100 may include a silicon or Silicon-on-insulator (SOI) substrate 10; a conductive layer 30 spaced apart from the substrate and including a metal or a metal compound; and a diffusion barrier layer 20 provided therebetween. The diffusion barrier layer 20 may be a thin film and perform a function of blocking movement of materials (atoms, electrons, and the like) between the substrate 10 and the conductive layer 30, for example, movement of metal atoms from the conductive layer 30 to the substrate 10.

The substrate 10 may be a silicon or Silicon-on-insulator (SOI) substrate as a semiconductor material, and more specifically, may be a p-type silicon as a p-type semiconductor material. The substrate 10 may additionally use a material doped with a dopant, but it is not limited thereto.

The conductive layer 30 may include a metal or a metal compound. The metal or metal compound may include a metal element including Ti, Ni, Cr/Au, Ag, or a combination of two or more selected from these, and any type that includes a metal element suitable for being applied as an electronic device, such as a metal electrode, metal interconnection, or the like, may be used without limitation.

The substrate 10 and the diffusion barrier layer 20 may directly contact to form a van der Waals junction by van der Waals force (vdW). Specifically, the junction between the silicon lattice on the surface of the substrate 10 and the diffusion barrier layer 20 may be formed owing to bonding by the van der Waals force. Each interface is physically and distinctly separated while atoms in each layer are not interchangeably mixed with or penetrating each other, i.e., a van der Waals gap is formed between the substrate 10 and the diffusion barrier layer 20. In particular, in the process of manufacturing the diffusion barrier layer 20, a diffusion barrier layer 20 of uniform thickness may be formed while minimizing physical damage to the surface by applying a transfer process, more specifically, a wet transfer process. As the diffusion barrier layer 20 formed by van der Waals bonding is provided on the surface of the substrate 10, highly reactive dangling bond on the surface of the substrate 10 is removed, and unique properties of the substrate 10 can be preserved, so that it can be advantageously applied to implementation of a highly integrated device.

The diffusion barrier layer 20 and the conductive layer 30 may also directly contact, and the interface between these two may ideally form a van der Waals (vdW) junction, but in reality, it may include an intermixing region due to diffusion of metal atoms of the conductive layer 30 into the diffusion barrier layer 20 without forming the van der Waals (vdW) junction.

The movement/diffusion of materials (atoms) between the substrate 10 and the conductive layer 30 may be controlled through the diffusion barrier layer 20, and through this, injection of electrons may be controlled. In the conventional metal-semiconductor interface forming direct contact, as metal atoms may diffuse or penetrate into the silicon crystal by a general deposition method that forms a metal electrode, an intermixing defect of heterogeneous elements may be formed. However, as the diffusion barrier layer 20 is provided, the integrated structure according to the present invention may block diffusion of metal atoms from the conductive layer 30 into the lattice of the substrate 10 (e.g., metal→Si direction). Accordingly, as formation of an intermixing junction by metal atoms diffusing into the silicon substrate crystal and formation of a silicide, which is a compound of silicon and metal, are suppressed, and the interface defect density is reduced, there is an effect of blocking electron injection in the reverse direction from the substrate 10 to the conductive layer 30 (e.g., in the direction of Si→metal). According thereto, contact resistance at the interface between the substrate 10 and the conductive layer 30 is reduced, trap density is reduced, and height of the Schottky barrier is reduced. Accordingly, as a quasi-ideal interface may be formed by reducing leakage current of the electronic device and maximizing rectification characteristics through the diffusion barrier layer 20, there is an effect of improving electrical characteristics.

In addition, injection of holes from the conductive layer 30 toward the substrate 10 may be controlled through the diffusion barrier layer 20. Specifically, as the efficiency of injecting holes from the metal of the conductive layer 30 toward the substrate 10 (e.g., metal→Si direction) is improved through the diffusion barrier layer 20, the ON/OFF ratio, which is the driving performance of the device, can be improved as much as more than 100 times. This is since that as formation of the metal-induced gap state by the penetration of metal atoms into the lattice of silicon (Si) is suppressed through the application of the diffusion barrier layer 20, the Fermi level according to voltage driving can be freely controlled without the Fermi level pinning phenomenon at the metal/semiconductor interface. As a result, it can be explained that hole injection efficiency can be improved by fundamentally eliminating the factors that hinder hole injection due to such a reason.

In particular, in order to enhance the effect of hole injection efficiency, the diffusion barrier layer 20 may be formed as a monolayer, and when one or more layers are repeatedly laminated to be formed as a multilayer of two or more layers, the hole injection efficiency may be lowered, and this may not be desirable. The thickness of the monolayer diffusion barrier layer 20 that enhances the hole injection efficiency may be as shallow as a nano to sub-nano scale or lower, and may be extremely thin as much as 1 nm or lower, and excellent characteristics can be maintained while the thickness is small. The thickness of the diffusion barrier layer 20 may be 0.1 to 10 Å, specifically 0.3 to 9 Å, and more specifically 0.5 to 8 Å. In a specific example, the thickness of the diffusion barrier layer 20 may be 7 Å, but it is not limited thereto. The diffusion barrier layer 20 like this may be advantageously applied to implementation of a highly integrated device having a fine line width.

In addition, the diffusion barrier layer 20 may have a low resistivity value of about $10^{-2}$ Ω·cm or smaller, specifically about 104 to $10^{-2}$ Ω·cm. Since the diffusion barrier layer 20 has low resistivity, it may have excellent electrical conductivity of a level similar to that of a metal or a semimetal. However, when the thickness of the diffusion barrier layer 20 is extremely thin, for example, 1 nm or lower, it may have a resistivity value of semiconductor level.

The diffusion barrier layer 20 is a semiconductor material and may include a transition metal dichalcogenide (TMD) material. The transition metal dichalcogenide material may have a two-dimensional crystal structure and excellent diffusion protection properties, and various advantages such as being formed in a very small thickness and the like. The transition metal dichalcogenide (TMD) may be a material having n-type or p-type semiconductor properties without doping, and particularly, the transition metal dichalcogenide (TMD) may be a material having p-type semiconductor properties. In order to enhance the doping characteristics, an atomic substitution process may be additionally performed in the chalcogen atom layer.

As the transition metal dichalcogenide (TMD) layer having p-type semiconductor properties is in contact with the p-type silicon substrate 10, it may suppress insulator silicon oxide ($SiO_2$) that is formed by chemical bonding of silicon (Si) dangling bonds on the surface of the silicon substrate 10 with oxygen atoms in the air, and may also suppress direct diffusion of metal atoms of the conductive layer 30 into the silicon lattice and formation of silicide during the deposition process of the conductive layer 30, and thus it may fundamentally block the problem of inhomogeneity of the silicon substrate. Through this, formation of the metal-induced gap state due to the metal may be blocked in the silicon band structure, and the Fermi level pinning phenomenon can be suppressed ultimately.

The transition metal dichalcogenide material may be expressed as chemical formula $MX_2$, wherein M is a transition metal element and may include, for example, Mo, W, Nb, V, Ta, Ti, Zr, Hf, Tc, Re, Ru, Co, Pd, Pt, Cu, Ga, In, Sn, Ge, Pb, or a combination of two or more selected from these, and X is a chalcogen element may include S, Se, Te, or a combination of two or more selected from these. Specifically, the transition metal dichalcogenide material may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PdTe_2$, or a combination of two or more selected from these. More specifically, the transition metal dichalcogenide material may include $MoS_2$, $MoSe_2$, $WS_2$, $WSe_2$, or a combination of two or more selected from these, and may include $WSe_2$ in a specific example, but it is not limited thereto.

The crystal structure of the transition metal dichalcogenide material has a covalent bond between the transition metal M and the chalcogen element X, and based on this, it has a hexagonal structure in the plane direction. It may also be possible to change the crystal structure through an additional phase change step or doping step.

In addition, when the diffusion barrier layer 20 may include a transition metal dichalcogenide (TMD) material, there is no dangling bond extending outside the diffusion barrier layer 20, so that when the diffusion barrier layer 20 is formed on the substrate 10, unique properties of the substrate 10 can be preserved, and it can be advantageously applied to implementation of a highly integrated device.

Figure 2:
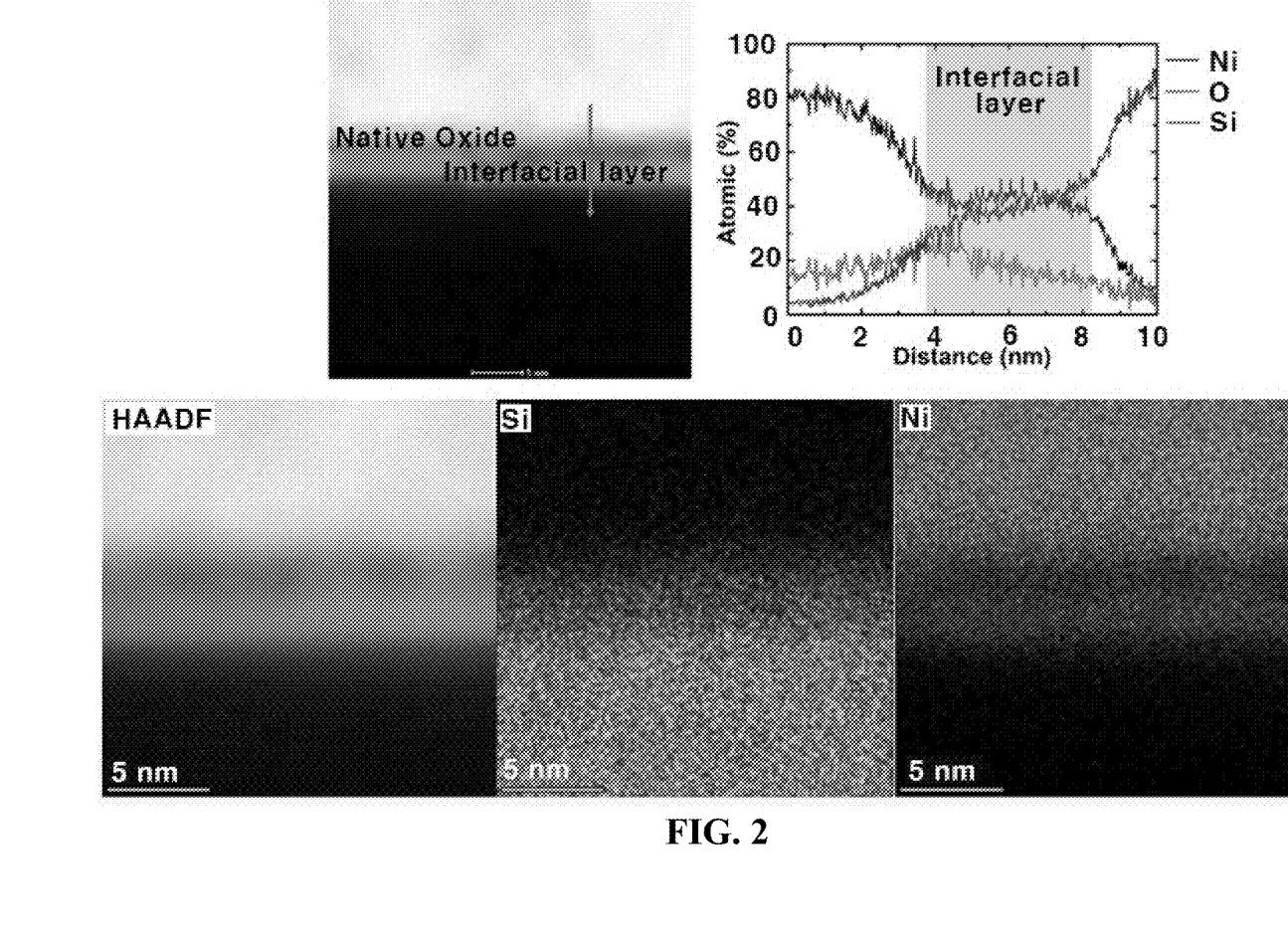
FIG. 2 shows a result of photographing the cross-section of a metal-semiconductor interface using a transmission electron microscope (TEM), a result of EDS-based element mapping, and a result of analyzing information on the element of each component, in an integrated structure according to an example of the present invention.

FIG. 2 shows a result of photographing the cross-section of a metal-semiconductor interface using a transmission electron microscope (TEM), a result of element mapping on the cross-section thereof, and a result of EDS analysis, in an integrated structure according to an example of the present invention.

Referring to FIG. 2, in the integrated structure in which the metal (Ni) electrode forms a direct contact with the substrate without having a $WSe_2$ diffusion barrier layer, it can confirm that the metal element (Ni) and the oxygen (O) element simultaneously exist in the interfacial layer that is in contact with the substrate as the metal atoms diffuse or penetrate into the silicon crystal, and therefore, it can be known that an intermixing region is formed by mixing heterogeneous elements.

Figure 3:
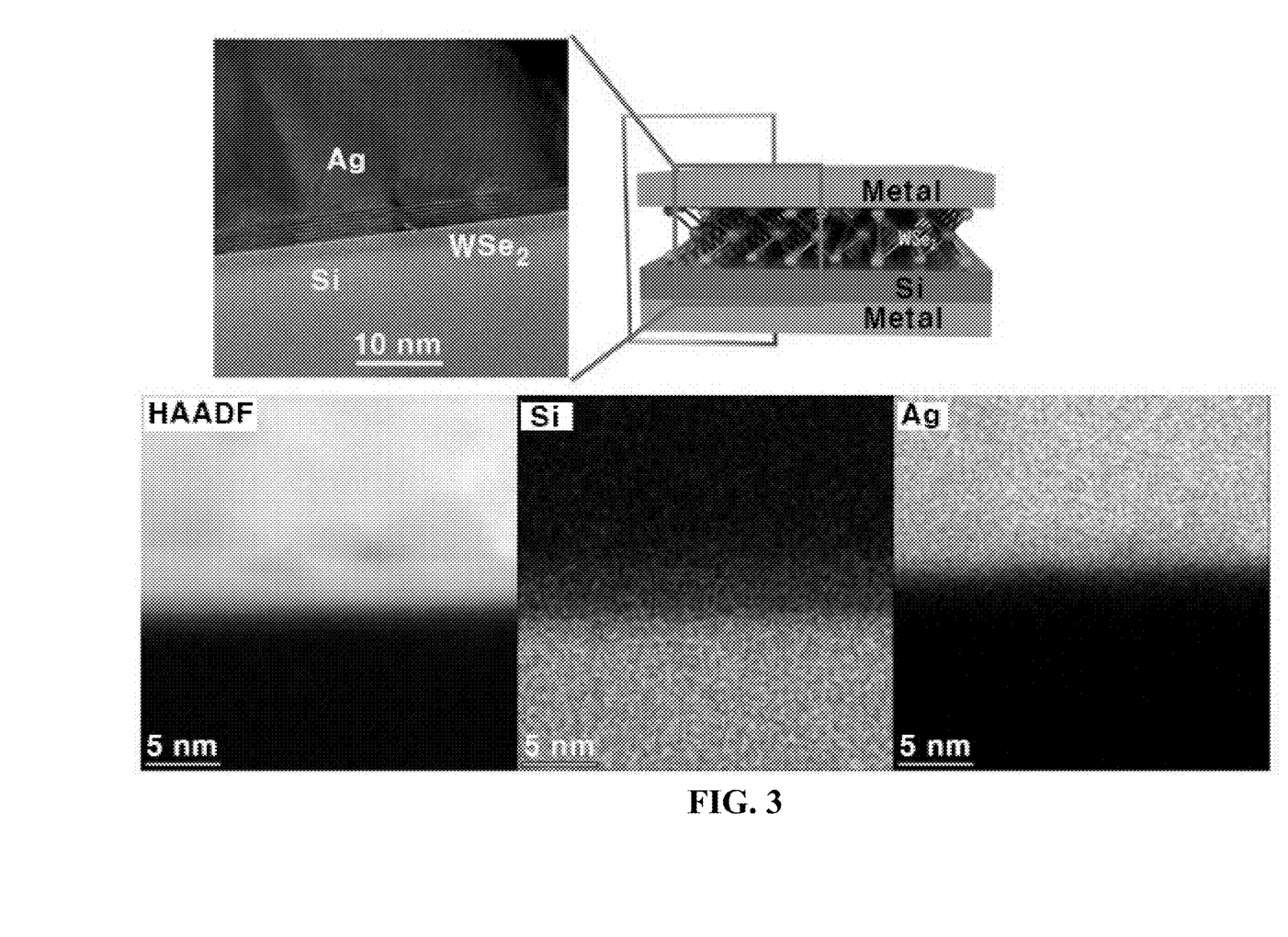
FIG. 3 shows a mimetic view of the cross-section of a metal-diffusion barrier layer-semiconductor interface, a result of photographing the cross-section of the metal-diffusion barrier layer-semiconductor interface using a transmission electron microscope (TEM), and a result of EDS-based element mapping, in an integrated structure according to an example of the present invention.

FIG. 3 shows a mimetic view of the cross-section of a metal-diffusion barrier layer-semiconductor interface, a result of photographing the cross-section of the metal-diffusion barrier layer-semiconductor interface using a transmission electron microscope (TEM), and a result of EDS element mapping on the cross-section thereof, in an integrated structure according to an example of the present invention.

Referring to FIG. 3, it can be confirmed that in the integrated structure in which the Si/$WSe_2$ interface is constructed by providing a $WSe_2$ diffusion barrier layer and metal (Ag) is laminated, an intermixing region is not formed as metal atoms do not diffuse or penetrate into silicon crystal.

Hereinafter, the present invention will be described in more detail using embodiments and comparative examples. However, the embodiments and comparative examples described below are intended to illustrate the present invention, and the scope of the present invention is not limited thereto.

Manufacturing Example 1: $WSe_2$ Thin Film Synthesis Method

To synthesize tungsten diselenide ($WSe_2$), a chemical vapor deposition (CVD) device provided with two heating zones is used. First, silicon oxide ($SiO_2$) is used as the substrate, and a quartz boat containing 480 mg of selenium (Se, 99.5% Sigma-Aldrich) powder is disposed in the left heating zone, and a quartz boat containing mixed powder of 40 mg of NaCl (99%, Sigma-Aldrich) and 240 mg of tungsten oxide (WOx, 99.9%, Sigma-Aldrich) is disposed in the right heating zone. Thereafter, the distance between the two quartz boats is set to 40 cm, and the temperature of each heating zone is set to 870° C. in the left zone and 640° C. in the right zone, and $WSe_2$ is grown for 10 minutes. At this point, the flow rate of Ar/H$_2$ gas as carrier gas is 100/20 sccm, and the process pressure in the synthesis stage is optimized to 1 to 100 Torr.

Manufacturing Example 2: Formation of Si/WSe$_2$ Interface Using Wet Transfer Method A PMMA (Poly (methyl methacrylate)) polymer solution is coated on the WSe$_2$ thin film grown on the silicon oxide (SiO$_2$) substrate manufactured in the method of Manufacturing Example 1. After PMMA coating, the manufactured PMMA/WSe$_2$/SiO$_2$ is immersed in a 3 wt % KOH solution to separate the PMMA/WSe$_2$ layer and the SiO$_2$ substrate. Meanwhile, a patterned silicon (Si) substrate is manufactured through a photo lithography process. The peeled PMMA/WSe$_2$ layer is transferred onto a p-type silicon (Si) substrate patterned through the photo lithography process, and the PMMA and photoresist (PR) are removed using acetone. Therefore, a WSe$_2$ thin film provided on a silicon (Si) substrate is manufactured using a wet transfer method, and a Si/WSe$_2$ interface having a van der Waals (vdW) junction is prepared.

Embodiment: Schottky Diode and Transistor Including Van Der Waals (vdW) Bonded Si/WSe$_2$ Interface A Schottky diode and a silicon (Si) channel transistor are manufactured by including the Si/WSe$_2$ interface manufactured in the method of Manufacturing Example 2. After an exposure process of patterning a metal electrode on the substrate including the Si/WSe$_2$ interface is progressed, a metal electrode is deposited by an e-beam evaporator. At this point, Ti, Ni, Cr/Au, or Ag is used as a metal that will be used as the metal electrode. Then, a Schottky diode is manufactured by forming a metal electrode in a lift-off method of removing the patterned photoresist, which is progressed in the exposure process, using acetone.

Meanwhile, an Si channel transistor is manufactured in a back gating structure using a silicon on insulator (SOI) wafer. The Si/WSe$_2$ interface fabricated in the method of Manufacturing Example 2 is formed on a Si channel having a channel length of 10 μm and a width of 2 μm, and a WSe$_2$ layer is bonded directly underneath the Ni electrode by depositing the Ni electrode thereon using an electron beam evaporator. Here, although it is ideal to form the WSe$_2$/Ni interface as a van der Waals (vdW) junction, the van der Waals (vdW) junction may not be formed in reality due to the issues such as the process or the like, and as the surface of the WSe$_2$ layer is damaged, an intermixing region due to diffusion of Ni atoms into the WSe$_2$ layer may be included. After patterning the channel through a photo lithography process, the surface of the SOI wafer is lightly oxidized in a dry oxidation method using plasma, and then a metal (Ni) electrode is formed using a method the same as the lift-off method described above.

Comparative Example: Fabrication of Schottky Diode and Transistor that do not Include Si/WSe$_2$ Interface A Schottky diode and a silicon (Si) channel transistor are manufactured using a method the same as that of the embodiment, except that the Si/WSe$_2$ interface manufactured in the method of Manufacturing Example 2 is not included.

Test Example: Measurement of Schottky Diode and Transistor Including Van Der Waals (vdW)-Bonded Si/WSe$_2$ Interface Schottky Barrier:

In order to analyze the effect of reducing the defects at the metal/semiconductor interface by forming the WSe$_2$ interface at the metal/semiconductor interface, the electrical characteristics of the Schottky diode are analyzed. Specifically, the I-V rectification characteristics, Schottky barrier height (SBH), and interface trap density D$_{it}$ are calculated to verify the effect of inserting the WSe$_2$ interfacial layer. The I-V rectification characteristics obtain the result of current (I) by applying a voltage (V) of −2 V to 2 V. The current of the Schottky diode may be generally determined by Equation 1 shown below.

$$I=I_0[\exp(qV/\eta kT)-1] \qquad \text{[Equation 1]}$$

In equation 1, q is the quantity of electric charge, V is the applied voltage, n is the ideality factor, k is the Boltzmann constant, and T is the temperature. In addition, saturation current I$_0$ is as shown in equation 2.

$$I_0=AA^*T^2 \exp(-q\varphi_0/kT) \qquad \text{[Equation 2]}$$

In equation 2, A is the diode area, A* is the Richardson constant, T is the temperature, q is the quantity of electric charge, k is the Boltzmann constant, and $\varphi_0$ is the Schottky barrier height (SBH). Through this, it can be seen that variables constituting the saturation current I$_0$ are the temperature T and the Schottky barrier height $\varphi_0$. Using this, saturation current is measured at seven temperature points at 10° C. intervals from room temperature (RT, 25° C.) to 75° C., and the Schottky barrier height is calculated. Since the current flow in an actual Schottky diode is dominantly determined by the current flowing due to a low SBH, it may be correctively calculated through the Barrier Height Inhomogeneities (BHI) model that compensates for the Schottky barrier height.

Charge Trap Density (D$_{it}$):

Since charge trap is mainly generated by interface defects, change in the interface defects may be indirectly inferred through the change in trap density. In addition, since the trap at the interface captures and releases charges, change in the trap density is quantitatively calculated by performing C-V (Capacitance-Voltage) and G-V (Conductance-Voltage) measurements. The C-V and G-V measurements obtain the changes in capacitance and conductance by fixing the frequency in units of 100 kHz from 100 kHz to 1 MHz and applying an AC voltage from −2 V to 2 V. The trap density D$_{it}$ may be quantitatively expressed by Equation 3 shown below.

$$D_{it}=(2.5/Aq)(G/\omega)_{peak} \qquad \text{[Equation 3]}$$

In equation 3, A is the diode area, q is the quantity of electric charge, G is the conductance, and ω is the angular frequency.

Figure 4:
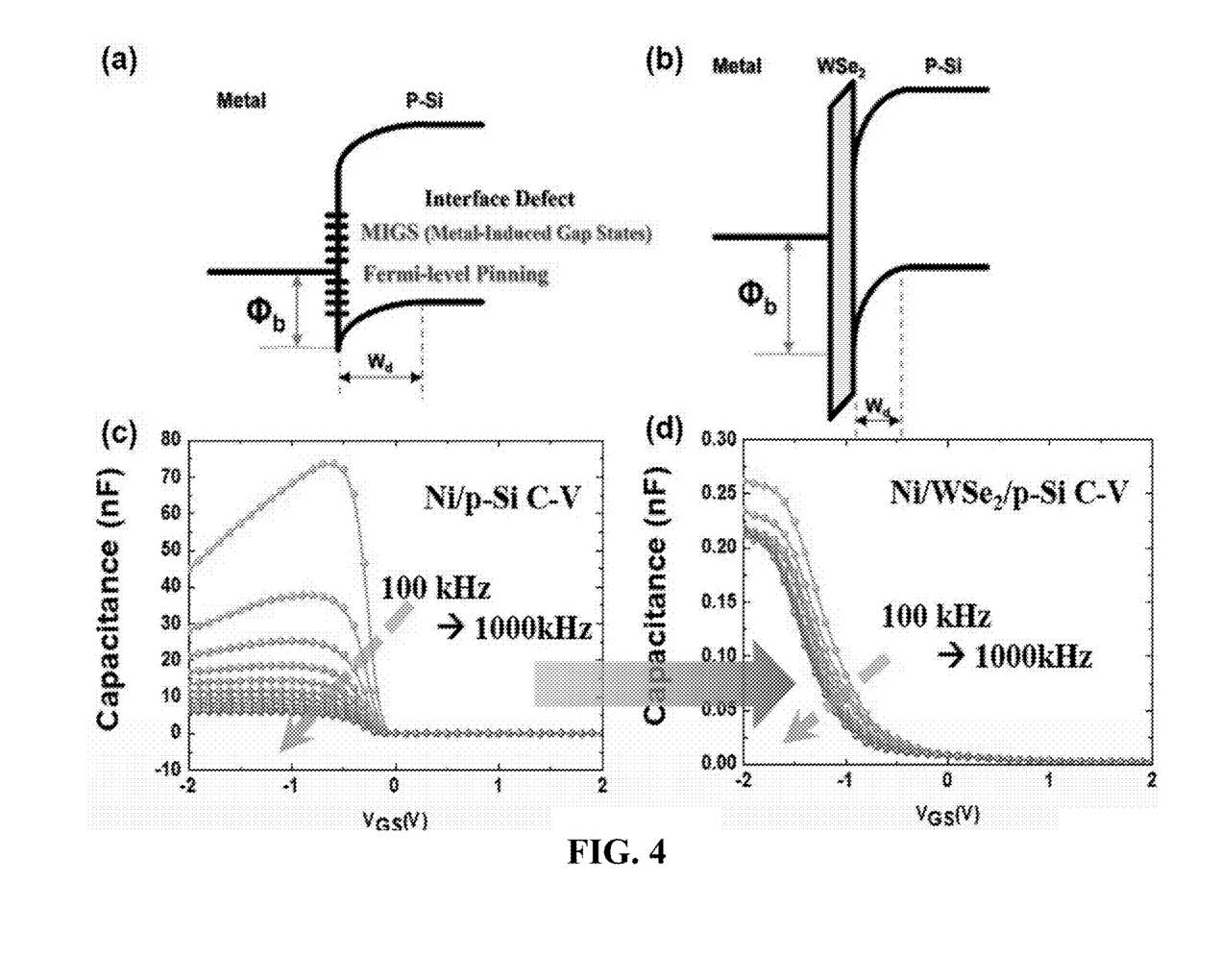
FIG. 4 is a view showing (a, c) an energy diagram and a C-V graph of a metal-semiconductor interface, and (b, d) an energy diagram and a C-V graph of a metal-diffusion barrier layer-semiconductor interface, in an integrated structure according to an example of the present invention.

FIG. 4 is a view showing (a, c) an energy diagram and a C-V graph of a metal-semiconductor interface, and (b, d) an energy diagram and a C-V graph of a metal-diffusion barrier layer-semiconductor interface, in an integrated structure according to an example of the present invention.

Referring to FIGS. 4 (a) and (c), at the metal-semiconductor interface forming a direct contact, as metal atoms may diffuse or penetrate into the silicon crystal by a general deposition method of forming a metal electrode, an intermixing defect of heterogeneous elements may be formed. Due to the intermixing defect, the intrinsic properties of the silicon (Si) substrate are modified, and a metal-induced gap state (MIGS) is formed in the silicon (Si) bandgap, which may generate a problem of causing a Fermi level pinning phenomenon when electrostatic actuation is driven through a gate. As a result, contact resistance of the metal-semiconductor interface increases, output current decreases, and the driving voltage of a device including the same increases, so that stress of the interface increases and may lead to degradation of the device.

Meanwhile, referring to FIGS. 4 (b) and (d), as the effect of inserting a diffusion barrier layer $WSe_2$ between the substrate and the metal, decrease in the height of the Schottky barrier and decrease in the interface trap density $D_{it}$ are confirmed. As a result of measuring the capacitance-voltage, it is confirmed that the defect density is reduced as the trap density $D_{it}$ is reduced as much as more than 10 times after inserting $WSe_2$. In addition, decrease in the defect density is confirmed to be similar to the result described above even in various metals such as Ni, Ti, Au/Cr, Ag, and the like which can be used as an electrode.

Figure 5:
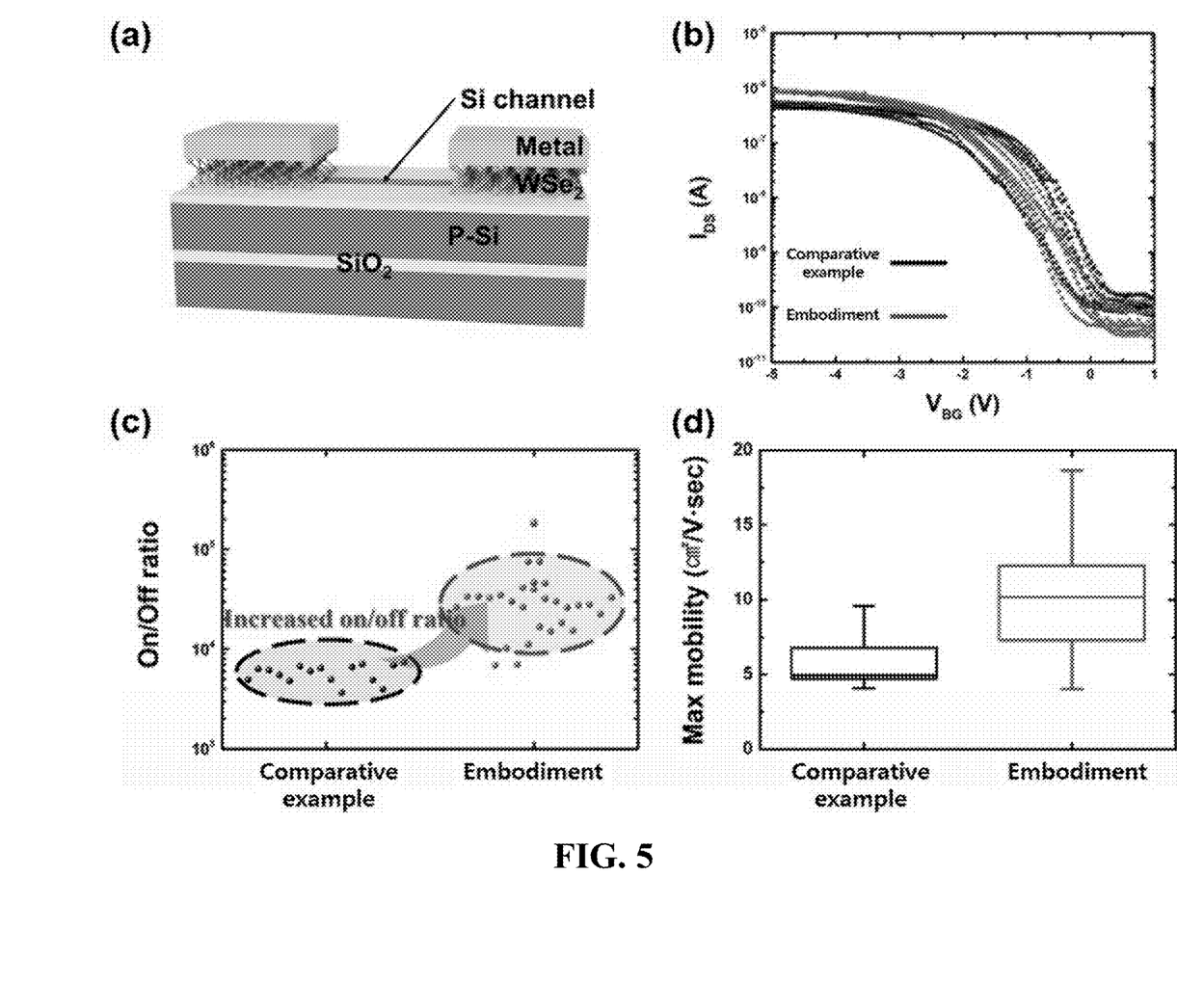
FIG. 5 is a view showing (a) a mimetic view of an electronic device including an integrated structure, and (b) an I-V graph, (c) an On/Off ratio, and (d) maximum mobility according to the presence or absence of a diffusion barrier layer, in an integrated structure according to an example of the present invention.

FIG. 5 is a view showing (a) a mimetic view of an electronic device (Si p-MOS) having an integrated structure, (b) an I-V graph according to the presence or absence of a diffusion barrier layer, (c) an On/Off ratio, and (d) statistical results of maximum mobility, in an integrated structure according to an example of the present invention.

Referring to FIG. 5, it shows an Si p-MOS device in which an electrode is formed as a $WSe_2$ and metal stacking structure on a silicon on insulator (SOI) substrate, and it can be confirmed that when drain voltage is applied, hole charges injected through the metal/$WSe_2$ electrode are transmitted through the silicon channel (Si channel) and the Si p-MOS device is driven.

According to the present invention as described above, an integrated structure according to a preferred embodiment of the present invention may include a silicon or Silicon-on-insulator (SOI) substrate, a conductive layer spaced apart from the substrate and including a metal or a metal compound, and a diffusion barrier layer provided therebetween. The substrate and the diffusion barrier layer may directly contact to form a van der Waals junction. Since the diffusion barrier layer may block diffusion of metal atoms into the substrate lattice by blocking movement of materials (atoms) between the substrate and the conductive layer and may also control injection of holes from the conductive layer toward the substrate, defects at the metal-semiconductor interface may be controlled to overcome the limitations of ultra-fine and highly integrated semiconductors.

The effects of the present invention are not limited to the effects mentioned above, and unmentioned other effects will be clearly understood by those skilled in the art from the following description.

Although the embodiments of the present invention have been described above with reference to the accompanying drawings, those skilled in the art may understand that the present invention can be implemented in other specific forms without changing the technical spirit or essential features. Therefore, the embodiments described above should be understood as illustrative and not restrictive in all respects.

DESCRIPTION OF SYMBOLS

100: Integrated structure, 10: Substrate, 20: Diffusion barrier layer, 30: Conductive layer

What is claimed is:

1. An integrated structure comprising:
a P-type silicon substrate or P-type silicon-on-insulator (SOI) substrate;
a conductive layer spaced apart from the substrate and including a metal or a metal compound; and
a diffusion barrier layer provided between the substrate and the conductive layer and includes a P-type semiconductor material, wherein
the substrate and the diffusion barrier layer directly contact and form a van der Waals junction, and
the diffusion barrier layer blocks the injection of electrons from the substrate to the conductive layer and performs the injection of holes from the conductive layer to the substrate.

2. The structure according to claim 1, wherein the diffusion barrier layer is a monolayer.

3. The structure according to claim 1, wherein a thickness of the diffusion barrier layer is 0.1 to 10 Å.

4. The structure according to claim 1, wherein the diffusion barrier layer includes a transition metal dichalcogenide material.

5. The structure according to claim 4, wherein the transition metal dichalcogenide material is expressed as chemical formula $MX_2$, wherein
M is a transition metal element including Mo, W, Nb, V, Ta, Ti, Zr, Hf, Tc, Re, Ru, Co, Pd, Pt, Cu, Ga, In, Sn, Ge, Pb, or a combination of two or more selected from these, and X is a chalcogen element including S, Se, Te, or a combination of two or more selected from these.

6. The structure according to claim 4, wherein the transition metal dichalcogenide material includes $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PdTe_2$, or a combination of two or more selected from these.

7. The structure according to claim 4, wherein a crystal structure of the transition metal dichalcogenide material is a hexagonal structure in a plane direction.

8. The structure according to claim 1, wherein the metal includes Ti, Ni, Cr/Au, Ag, or a combination of two or more selected from these.

9. An electronic device comprising an integrated structure according to claim 1.

* * * * *